United States Patent [19]
Poingt et al.

[11] Patent Number: 5,283,209
[45] Date of Patent: Feb. 1, 1994

[54] METHOD OF LOCALIZED TREATMENT ON A PROJECTION, IN PARTICULAR FOR LITHOGRAPHIC ETCHING ON A SEMICONDUCTOR SUBSTRATE

[75] Inventors: Francis Poingt, Ste Genevieve Des Bois; Jean-Louis Lievin, Paris; Elisabeth Gaumont-Goarin, Montrouge, all of France

[73] Assignee: Alcatel N.V., Amsterdam, Netherlands

[21] Appl. No.: 824,259

[22] Filed: Jan. 17, 1992

[30] Foreign Application Priority Data

Jan. 17, 1991 [FR] France .................. 91 00505

[51] Int. Cl.⁵ .......................................... H01L 21/302
[52] U.S. Cl. ...................................... 437/228; 437/229
[58] Field of Search ............... 437/231, 229, 228, 247

[56] References Cited

U.S. PATENT DOCUMENTS

| 4,722,910 | 2/1988 | Yasaitis | 437/203 |
|---|---|---|---|
| 4,789,646 | 12/1988 | Davis | 437/141 |
| 4,978,419 | 12/1990 | Nanda et al. | 437/229 |
| 5,093,225 | 3/1992 | Holmstrom et al. | 437/229 |
| 5,155,060 | 10/1992 | Ikeno et al. | 437/231 |

FOREIGN PATENT DOCUMENTS 0300563 1/1989 European Pat. Off. .

OTHER PUBLICATIONS

Ralph Williams, *Modern GaAs processing Methods*, Artech House, Boston & London, pp. 115-133 (date unknown).

"Postloped vias", IBM Technical Disclosure Bulletin, vol. 32, No. 8B, Jan. 1990, pp. 443-445, New York.

*Primary Examiner*—Olik Chaudhuri
*Assistant Examiner*—Richard A. Booth
*Attorney, Agent, or Firm*—Robbins, Berliner & Carson

[57] ABSTRACT

In the method, a protective resist (108) used for lithographic etching is caused to flow plastically under the constraint of its surface tension, thereby increasing its thickness around a projection (106) on which a window (104) is to be formed. The invention is particularly applicable to manufacturing semiconductor lasers.

10 Claims, 4 Drawing Sheets

METHOD OF LOCALIZED TREATMENT ON A PROJECTION, IN PARTICULAR FOR LITHOGRAPHIC ETCHING ON A SEMICONDUCTOR SUBSTRATE

The present invention relates to performing localized treatment, in particular such as forming a window through a layer of coating over a zone that constitutes a projection on a substrate.

The invention applies more particularly when said layer of coating is a thin layer whose thickness typically lies in the range 50 nm to 1000 nm, and when said substrate has a generally plane surface with said zone generally projecting to a height typically lying in the range 500 nm to 0.05 mm, and typically extending transversely over a distance lying in the range about 100 nm to about 0.1 mm.

More particularly still, the invention applies when the substrate is constituted by a semiconductor material, and the coating layer is constituted by a dielectric material, with the window needing to be formed through said layer in order to enable localized electrical contact to be made on the substrate. This applies in particular when manufacturing certain semiconductor lasers, for the purpose of localizing an electric current that serves to inject charge carriers into a strip-shaped active layer internal to said laser.

A known lithographic etching method for forming such a window includes the following operations:

depositing a coating layer on a substrate having a projecting zone on which a window is to be formed through said coating layer;

depositing a layer of lithographic resist on said substrate and said coating layer;

sensitizing said resist in selected areas;

selectively ablating the resist to eliminate it from over said projecting zone; and etching a window by applying a process against which said resist provides protection.

This known method is described, in particular, in a book entitled "Modern GaAs processing methods" by Ralph Williams, published by Artech House, Boston, London, pp. 115-133.

It suffers, in particular, from the drawback that it is difficult to bring the edge of the sensitized zone into alignment with the edge of the projection on which a window is to be formed with the required degree of accuracy. As a result the window that is actually formed is offset from the desired position.

A particular object of the present invention is to enable a window to be formed whose edges are more accurately aligned on those of a projection on which the window is to be formed. To this end, the present invention provides a method of localized treatment on a projection, in particular lithographic etching on a semiconductor substrate, in which method a protective resist is deposited outside a projecting zone on which treatment is to be performed, the treatment means against which said resist provides protection is then applied on said resist and on said zone, said method being characterized by the fact that prior to applying said treatment means, said protective resist is caused to move by plastic flow towards said projecting zone to at least increase its thickness in the immediate vicinity of said zone.

Such plastic flow displacement serves to establish or to reinforce a protective layer as a margin outside the projecting zone, by using forces such as gravity or surface tension for this purpose, which forces are capable, in the absence of any area-selecting control, of limiting their effects to the edges of the projecting zone because of the shape of the flanks of said zone and possibly because of an appropriate choice of wettabilities in the various zones of the substrate by the resist.

Ways in which the present invention can be implemented are described below with reference to the accompanying diagrammatic figures, it being understood that the items and dispositions mentioned and shown are given purely by way of non-limiting example. When the same item or a magnitude of the same kind appears in more than one of the figures, it is designated therein by the same reference symbol.

DETAILED DESCRIPTION OF THE INVENTION

Figure 1A:
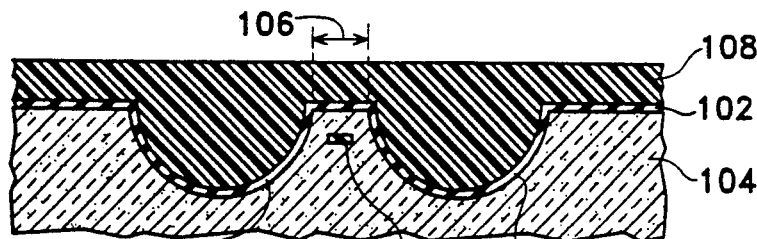
FIGS. 1A through 1F are a series of views in a transverse plane through a first substrate at successive steps in implementing the method of the present invention.
Figure 1B:
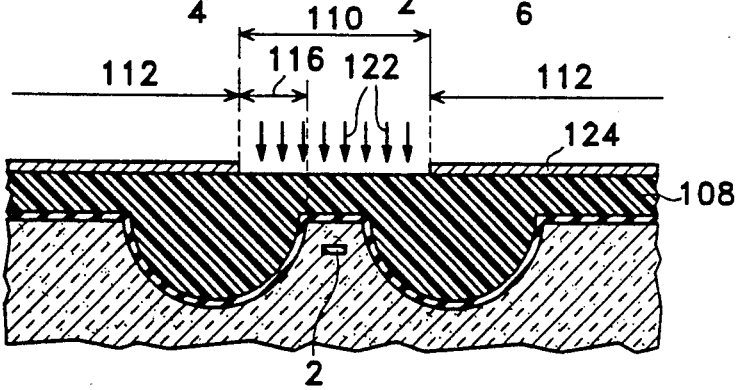

With reference to FIG. 1, a succession of operations for forming a window is initially described in general terms, which operations are common as to the functions described both to the method of the invention and to said known method.

Depositing the coating. This operation comprises depositing a thin layer of coating constituted by a coating material 102 onto a substrate 104 having a projecting zone 106 on which a window is to be formed through said coating layer.

Depositing the resist. This operation comprises depositing a layer 108 (FIG. 1A) of resist on the substrate 104 and said coating layer 102, the resist being constituted by a sensitizable protective resin and being of sufficient thickness to cover the projecting zone 106.

Sensitizing selected areas of said resist to sensitize the resist in a sensitized zone 110 to a first ablation process (FIG. 1B), said zone extending over the projecting zone 106 and said resist not being sensitized to said process in an outer zone 112 outside said sensitized zone.

Figure 1C:
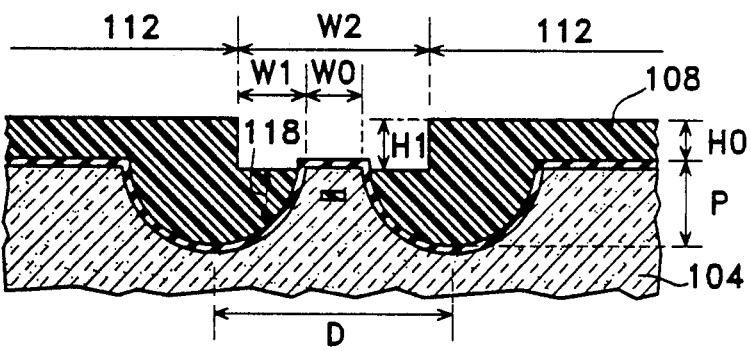
Figure 1D:
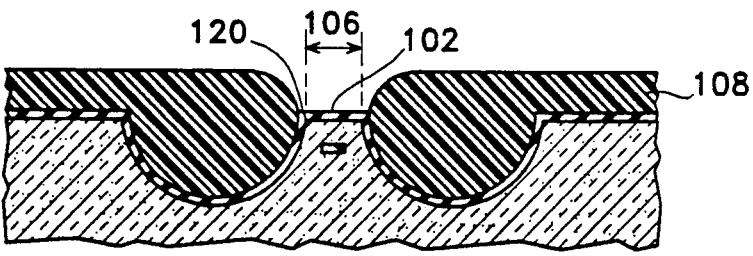
Figure 1E:
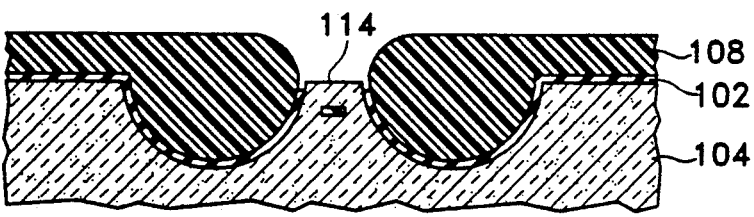
Figure 1F:
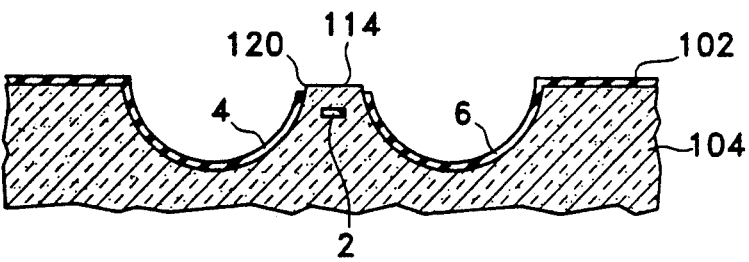

Selectively ablating the resist by said first resistablating method. This operation eliminates the resist over the projecting zone 106 while allowing it to remain in the outer zone 112 (FIG. 1C).

And etching a window 114 by applying a process for ablating the coating, the layer of resist 108 constituting a protection against said process.

Compared with the above known method, the present invention is distinguished by the following points:

The resist 108 (FIGS. 1C and 1D) is selected to be capable of flowing plastically when placed under plastic flow conditions that do not make it lose its protective qualities and that can be withstood by the substrate 104 and the coating layer 102. The sensitized zone then includes not only the projecting zone 106 but also at least an additional sensitized strip 116 of limited width that extends beyond at least one of the edges 120 of said projecting zone. In addition, said selective ablation of the resist is "restrained" ablation organized to allow the resist to remain but with reduced thickness 118 (FIG. 1C) in said additional sensitized strip, and a resist plastic flow operation is performed after said restrained ablation of the resist and before said etching of the window. The plastic flow operation includes applying said plastic flow conditions so that the surface tension forces of said resist bring a fraction of the mass thereof from the outer zone 112 into the additional sensitized strip 116 and up to the edge 120 of the projecting zone. In addition, an anti-wetting condition is satisfied so that during said plastic flow operation the resist does not spread over the coating layer 102 in the projecting zone 106.

The presence of a sufficient thickness of resist on the edges of the projection, without resist overflowing onto the projection, has the effect of ensuring that the edges of the window that is to be etched through the coating layer are aligned with a high degree of accuracy on the edges of the projection even though the edges of the sensitized zone may be defined with a much lower degree of accuracy. It also has the effect of protecting the coating layer on the flanks of the projecting zone.

When implementing the method of the present invention, the following advantageous dispositions may also be adopted:

The conditions for plastic flow include a flow temperature higher than that at which said restrained ablation operation is performed on the resist. This disposition has the advantage that it is often relatively simple to perform the plastic flow operation by raising the temperature. Nevertheless, other ways of performing this operation may be advantageous in some cases. For example, the substrate together with the coating layer and the protective resist may be placed in an enclosure in which a high or saturating vapor pressure prevails of a solvent which then impregnates the resist and makes it fluid.

When plastic flow is performed by raising the temperature, a resist is selected that has a large difference, e.g. about 50° C., between a vitreous transition temperature and a spoiling temperature which is higher, and beyond which the useful properties of the resist are spoilt, in particular with respect to its suitability for subsequently being completely removed from the substrate. The plastic flow temperature is then selected to lie between said two temperatures. This disposition has the advantage of making it easy to reach a plastic flow temperature of the resist without running the risk of making it lose its useful properties.

In another advantageous disposition, said anti-wetting condition is that the resist does not wet said coating material. Naturally, the resist must nevertheless adhere to some extent on said coating material during said operation of depositing the resist. Such adhesion may, in particular, result from the fact during deposition the resist includes a large fraction of a solvent that is volatile and that is subsequently eliminated during annealing operations. This disposition has the advantage that it can be implemented merely by selecting an appropriate resist. Nevertheless, for this to be possible, such a resist must be available. If that is not the case, then an alternative disposition would be, for example, after the restrained ablation of the resist, depositing a very thin layer of substance that prevents wetting by the resin on the coating layer in the plateau of the projecting zone but not on the flanks of the projection.

Given the positioning error that may arise when positioning the edge of the sensitized zone relative to the edge of the projecting zone, the effective width of the additional sensitized strip may differ from an ideal width W1 that would arise if there were no error. Considering the maximum error that may occur in such positioning, the effective width may lie in random manner between a lower limit equal to the ideal width minus the maximum error and an upper limit equal to the ideal width plus the maximum error. The ideal width is therefore chosen to be greater than the maximum error. Nevertheless, the ideal width should not be too wide since that would require the resist to flow plastically over a considerable distance and would therefore unnecessarily require flow conditions to be established that are relatively difficult to obtain.

Figure 2A:
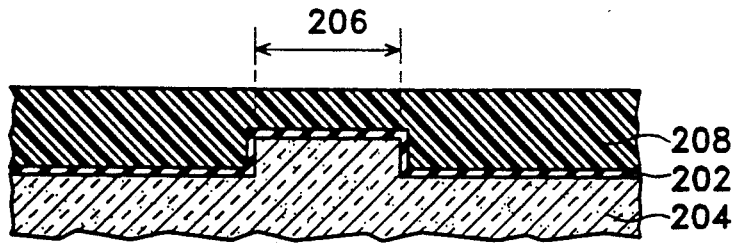
FIGS. 2A through 2F show analogous views of a second substrate at analogous steps of such a method.
Figure 2B:
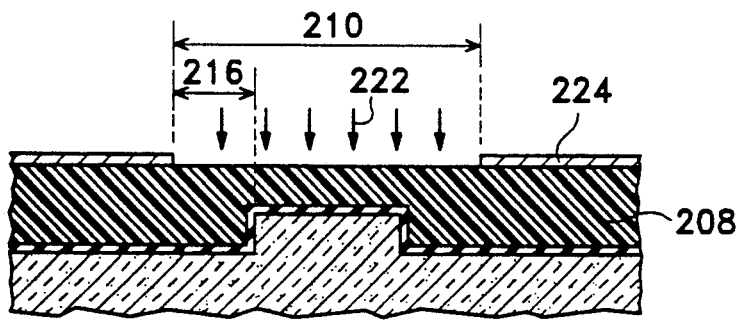
Figure 2C:
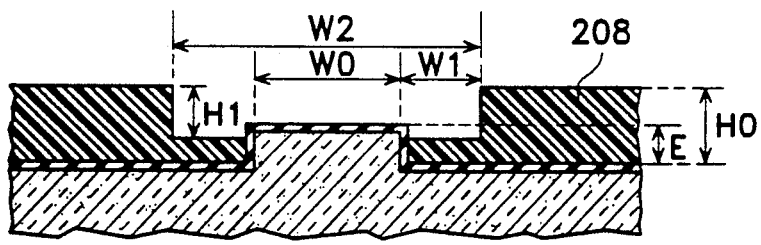
Figure 2D:
Figure 2E:
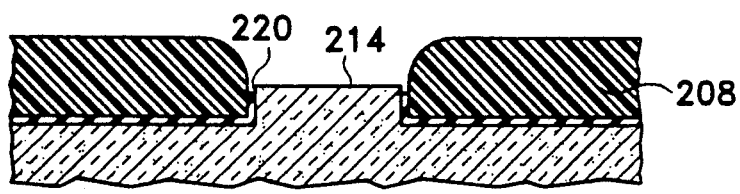

In numerous cases of semiconductor laser manufacture, the width W2 of the sensitized zone is advantageously selected to lie in the range $2W0 < W2 < 3W0$ where W0 is the width of the projecting zone, which gives $W0/2 < W1 < W0$ (see FIG. 2C).

In another advantageous disposition, said sensitizing of selected areas is performed by insulation using radiation 122 (FIG. 1B) through a removable mask 124. This disposition has the advantage of using a photolithographic etching process that is well known and that presents no special difficulties in the context of the present invention.

In many applications of the invention, after a window 114 has been formed, the resist is completely ablated by a second resist ablating process.

In such applications, said substrate is typically a semiconductor substrate and said coating layer is a dielectric layer. In addition, after the window has been formed, a conductive material is deposited to enable electric current to flow through the window that has been formed. This deposit of conductive material is not shown.

Implementations of the above-described method are described below in somewhat more detail. These implementations use the advantageous dispositions described above.

FIGS. 2 and 3 show items that are similar to those already mentioned above with reference to FIG. 1. When these items correspond between these three figures, their reference numerals have the same tens and units digits, while their hundreds digits are equal to the numbers of the corresponding figures.

In these three figures, letters A to F designate analogous steps in the method of the invention.

In FIG. 1, the substrate 104 is intended for use in manufacturing a "buried strip" semiconductor laser whose active layer 2 is in the form of a strip extending perpendicularly to the plane of the figure. This layer extends between two insulating channels 4 and 6 that have been etched in the substrate over a limited width, with a distance D between these axes, and a depth P. These channels leave the projecting zone 106 between them whose width is about 0.005 mm. Such lasers are known under the initials FBH or PBH, SIBC, DCPBH.

In such circumstances, it seems appropriate to satisfy the following inequalities:

$$W2 \leq D \text{ and } H0 \geq P/2$$

where H0 is the thickness of the resist deposited during said resist deposition operation on the non-etched portion of the substrate. The thickness of resist H1 that is removed during the restrained ablation of the resist is then greater than H0 and less than $H0 + P/2$.

As shown in FIG. 2, a projection may be formed by etching the entire surface of a substrate 204 apart from its projecting zone 206 whose width W0 is about 0.002 mm. The method of the invention makes it possible to localize current injection in a laser ridge constituted by the projecting zone 206 which extends perpendicularly to the plane of the sheet (see FIG. 2C).

Under such circumstances, if the thickness of the resist deposited at a distance from the projecting zone 206 is written and the height of the plateau of said zone above the surrounding surface is written E, then it is advantageous for H0 to be not less than 2E.

As shown in FIG. 3, a projecting zone 306 is formed by depositing additional material 8 on a substrate 304. This additional material is deposited in the form of a layer and then etched to form a strip which extends perpendicularly to the plane of the figure and which is about 0.001 mm wide.

Figure 2F:
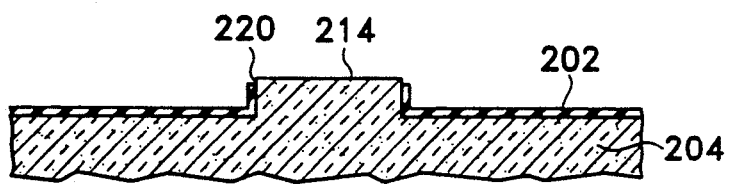
Figure 3A:
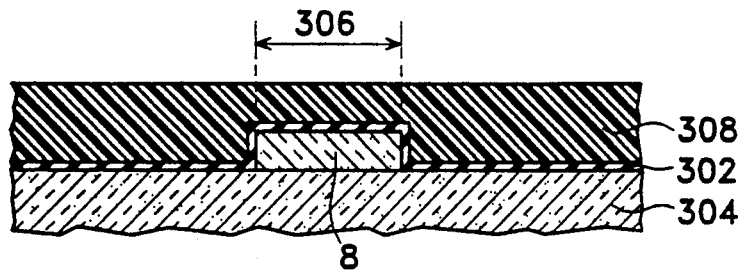
FIGS. 3A through 3F show analogous views of a third substrate at analogous steps of such a method.
Figure 3B:
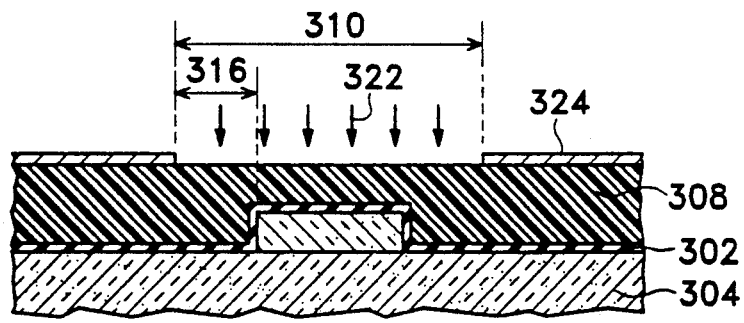
Figure 3C:
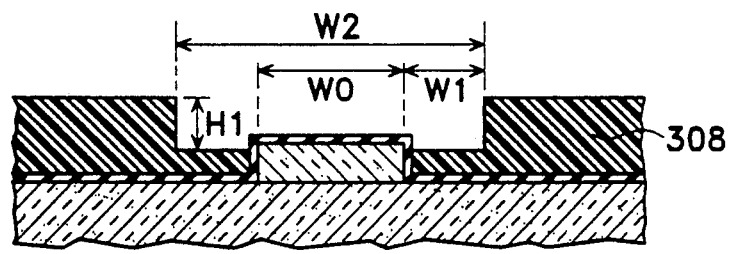
Figure 3D:
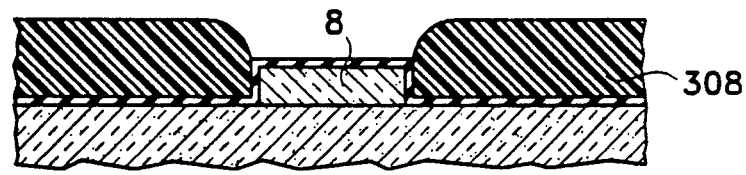
Figure 3E:
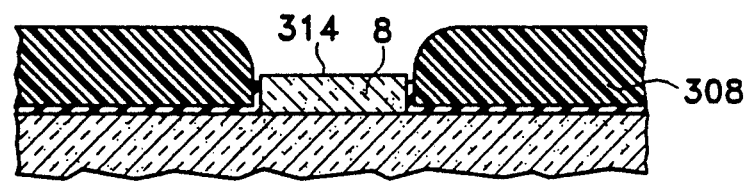
Figure 3F:
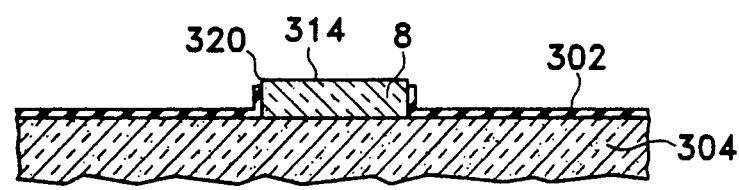
Figure 4A:
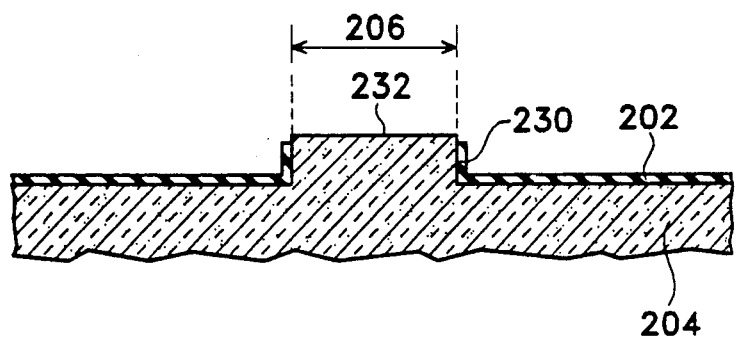
FIGS. 4A through 4C show views of the second substrate, firstly after applying the method of the present invention, and also after applying lithographic methods that are analogous but that do not implement the invention.

FIG. 4A corresponds to FIG. 2F, i.e. it shows the result obtained by the method of the invention. It can be seen that the coating layer 202 remains on the flanks such as 230 of the projecting zone 206 up to the vicinity of the plateau 232 of said zone.

Figure 4B:
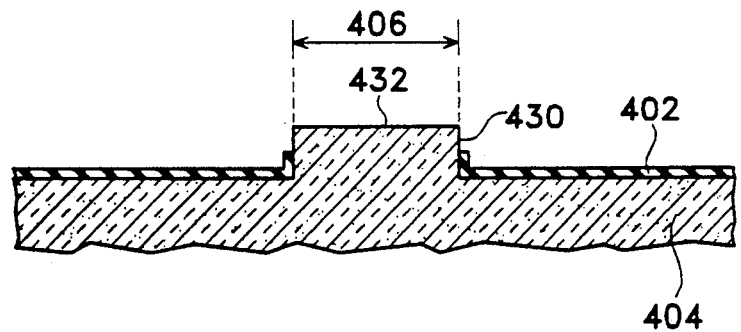
Figure 4C:
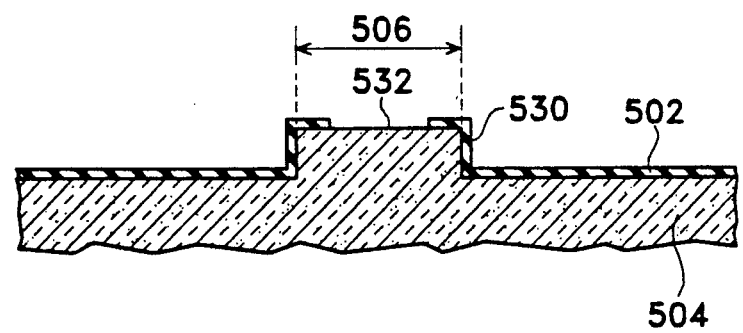

The methods used for treating the substrates 404 and 504 in FIGS. 4B and 4C are analogous to the method of the invention as described above, but they do not include the operation of causing the resist to flow plastically.

In FIG. 4B, for a sensitized zone that is wider than the projecting zone 406, and when restrained ablation of the resist has left an effective protective layer around said zone, the coating layer 402 is removed from the flanks 430 of the projecting zone 406 down to a relatively great distance from the plateau 432 of said zone.

In FIG. 4C, when the sensitized zone is a little narrower than the projecting zone 506, the coating layer 502 remains on the margins of the plateau 532 of said zone.

In a particular implementation of the method of the present invention as shown in FIG. 1, the coating layer 102 was constituted by silicon nitride and had a thickness H0 of 200 nm and the projecting zone 106 had a height P relative to the surrounding regions of the substrate 104 of about 2000 nm.

The protective resist 208 was selected to be a photosensitive resin of the Novolaque kind as sold under the reference TF20 and under the commercial name Microposit by the American firm Shipley. During the operation of depositing the resist, it was spread on a spinner at 5000 revolution per minute (rpm) for 30 seconds and then at 10,000 rpm for 3 seconds. It was then annealed at 90° C. for 20 minutes. The resulting thickness was 0.005 mm above the projecting zone. The insulation operation lasted for 25 seconds at a power of 20 mW/cm$^2$. The restrained ablation operation was performed in two 15 second periods using a developer sold by the same firm under the reference 351 and diluted in six volumes of water. It was monitored using an optical microscope. The operation of subjecting the resist to plastic flow was the result of annealing to a plastic flow temperature of 150° C. for 15 minutes. The window was formed through the dielectric coating (Si$_3$N$_4$) using a CF$_4$ plasma (100 W, 15 minutes). Complete ablation of the resin was performed using a solvent sold by the American firm General Chemical under the reference A20 Stripper.

An important advantage of the method of the present invention is that it avoids the need for the insulation mask to be accurately aligned relative to the projecting zones that are to be cleared. During the plastic flow operation, this method effectively achieves "automatic" alignment (auto-alignment) of the edges of the protective resist layer on the edges of the projecting zone. Such auto-alignment improves the quality of a component such as a semiconductor laser when the method of the invention is used in the manufacture thereof.

A second advantage is that accurate definition of the edge of the window does not require a hard insulation mask to be applied against the surface of the substrate. It results from the fact that the edge of the sensitized zone can be defined relatively inaccurately. This is important when working on fragile substrates such as those constituted by gallium arsenide GaAs or indium phosphide InP.

We claim:

1. A method of localized lithographic etching on a projection from a semiconductor substrate, comprising the steps:

depositing a protective resist over an extended area including a projecting zone on which a localized etching treatment is to be applied, said projecting zone being defined by a projecting edge surrounding a projecting area, said protective resist providing protection against said treatment.

then removing said protective resist from an enlarged removal area extending beyond said projecting zone, then causing said protective resist to move by plastic flow from outside said enlarged removal area and towards and into contact with said projecting edge, so as to form a thick layer of protective resist adjacent a restricted treatment area free from said protective resist, said restricted treatment area being smaller than said enlarged removal area and self-aligned with said projecting area such that only said projecting area is not provided with protection against said treatment, and then applying said treatment both to said thick layer of protective resist and to said restricted treatment area.

2. A method of forming a window on a projecting zone of a substrate, comprising the sequential steps:

depositing a thin coating layer of a coating material on a portion of said substrate which includes said projecting zone;

depositing on said substrate and said coating layer a layer of sensitizable protective resist having sufficient thickness to cover said projecting zone, said protective resist being capable of plastic flow when placed in plastic flow conditions which do not cause it to lose its protective qualities and which can be withstood by said substrate and by said coating layer;

sensitizing selected areas of said resist to sensitize it to a first resist ablation process said selective ablation of the resist being restrained ablation to allow said protective resist to remain at reduced thickness in said additional sensitized strip; in a sensitized zone extending over said projecting zone, said resist not being sensitized to said process in an outside zone outside said sensitized zone, said sensitized zone including not only said projecting zone but also at least one additional sensitized strip of limited width beyond at least one of the edges of said projecting zone;

selectively ablating the resist by said first resist ablation process to eliminate said resist over said projecting zone and allowing it to remain in said outside zone in a sensitized zone extending over said projecting zone, said ablating being sufficiently restrained to allow said protective resist to remain at a reduced thickness in said additional sensitized strip;

causing plastic flow of the resist by applying said plastic flow conditions so that the forces of gravity and/or of surface tension of said resist bring a fraction of the mass thereof from said outside zone into said additional sensitized strip up to the edge of said projecting zone; and etching said window in said coating layer by applying a coating ablation means which is suitable for eliminating said coating material and against which said layer of protective resist constitutes a protection.

3. A method according to claim 2, wherein said plastic flow conditions include a plastic flow temperature greater than the temperature at which said restrained ablation of the resist is performed.

4. A method according to claim 3, wherein said protective resist has a large difference between a vitreous transition temperature and a spoiling temperature, with said plastic flow temperature lying between said two temperatures.

5. A method according to claim 2, wherein said protective resist is not wettable for said coating material.

6. A method according to claim 2, wherein said sensitizing step utilizes radiation through a removable mask.

7. A method according to claim 2, wherein after said forming of a window, said resist is completely ablated by a second resist ablation process.

8. A method according to claim 2, wherein said substrate is a semiconductor substrate and said coating layer is a dielectric layer.

9. A method according to claim 8, wherein, after said window has been formed, conductive material is deposited to enable electricity to flow through said window.

10. A method according to claim 1 wherein said resist is a protective resin.

* * * * *